(12) United States Patent
Viey et al.

(10) Patent No.: US 11,656,267 B2
(45) Date of Patent: May 23, 2023

(54) TRANSISTOR CHARACTERIZATION

(71) Applicant: Commissariat à l'Énergie Atomique et aux Énergies Alternatives, Paris (FR)

(72) Inventors: Abygael Viey, Grenoble (FR); William Vandendaele, Grenoble (FR); Jacques Cluzel, Grenoble (FR); Jean Coignus, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 17/217,791

(22) Filed: Mar. 30, 2021

(65) Prior Publication Data

US 2021/0302487 A1    Sep. 30, 2021

(30) Foreign Application Priority Data

Mar. 31, 2020   (FR) ...................... 2003211

(51) Int. Cl.
*G01R 31/12* (2020.01)
*G01R 31/26* (2020.01)
*G01R 31/3177* (2006.01)
*G01R 27/02* (2006.01)
*G01R 27/26* (2006.01)

(52) U.S. Cl.
CPC .............. *G01R 31/2621* (2013.01)

(58) Field of Classification Search
CPC .... G01R 31/12; G01R 31/26; G01R 31/3177; G01R 27/02; G01R 27/26
See application file for complete search history.

(56) References Cited

U.S. PATENT DOCUMENTS

| 6,714,027 B1 * | 3/2004 | Lui ..................... G06F 30/367 716/136 |
| 8,525,528 B2 * | 9/2013 | Garros ............... G01R 31/2621 702/65 |
| 2016/0209466 A1 * | 7/2016 | Coignus ................. G11C 29/04 |

FOREIGN PATENT DOCUMENTS

GB    2351156 A    12/2000

OTHER PUBLICATIONS

Preliminary Search Report for French Application No. 2003211, dated Nov. 24, 2020.
Bury et al., Reliability in gate first and gate last ultra-thin-EOT gate stacks assessed with CV-eMSM BTI Characterization. 2013 IEEE International Reliability Physics Symposium (IRPS), Monterey, CA, USA, Apr. 2013, pp. GD.3.1-GD.3.5, doi: 10.1109/IRPS.2013.6532087.
Ji et al., A new mobility extraction technique based on simultaneous ultrafast Id-Vg and Ccg-Vg measurements in MOSFETs. IEEE Transactions on Electron Devices, vol. 59(7); Jul. 2012, pp. 1906-1914.

(Continued)

*Primary Examiner* — Neel D Shah
(74) *Attorney, Agent, or Firm* — Wolf, Greenfield & Sacks, P.C.

(57) ABSTRACT

A method of characterizing a field-effect transistor, including: a step of application, to the transistor gate, of a single voltage ramp; and a step of interpretation both of gate capacitance variations and of drain current variations of the transistor.

10 Claims, 4 Drawing Sheets

(56) References Cited

OTHER PUBLICATIONS

Ji et al., A new ultra-fast single pulse technique (UFSP) for channel effective mobility evaluation in MOSFETs. IEEE Int. Conf. Microelerctronic Test Structures (ICMTS), Osaka, Japan, Mar. 2013, pp. 64-69, doi: 10.1109/ICMTS.2013.6528147.

Ji et al., An ultra-fast single pulse (UFSP) technique for channel effective mobility measurement. 2016 13th IEEE International Conference on Solid-State and Integrated Circuit Technology (ICSICT), Hangzhou, China, Mar. 2016, pp. 516-521, doi: 10.1109/ICSICT.2016.7998966.

Joo et al., Flat-band voltage and low-field mobility analysis of junctionless transistors under low-temperature. IOP Publishing. Semiconductor Science and Technology; v29(4); Mar. 2014, 1-13.

FR 2003211, Nov. 24, 2020, Preliminary Search Report.

\* cited by examiner

TRANSISTOR CHARACTERIZATION

CROSS-REFERENCE TO RELATED APPLICATION

This application claims priority to French patent application number 2003211, filed Mar. 31, 2020, the contents of which is incorporated herein by reference in its entirety.

TECHNICAL BACKGROUND

The present disclosure generally concerns electronic devices and, more particularly, field-effect transistor characterization methods.

PRIOR ART

To characterize a field-effect transistor, the effective mobility of the majority charge carriers (electrons or holes) in its conduction channel may in particular be estimated. The effective mobility values obtained by usual characterization methods are however often erroneous, for example, due to a trapping of charges during the measurement. This alters the transistor characterization.

SUMMARY

There is a need to improve transistor characterization devices and methods.

An embodiment overcomes all or part of the disadvantages of known transistor characterization devices and methods.

An embodiment provides a method of characterizing a field-effect transistor, comprising:
a step of application, to the gate of the transistor, of a single ramp of the gate voltage;
a step of measurement of a drain current and of a gate capacitance of the transistor during the application of the ramp of the gate voltage; and
a step of interpretation both of variations of the gate capacitance and of variations of the drain current of the transistor.

According to an embodiment, the ramp is applied for a time period in the range from 1 µs to 20 µs, preferably from 1 µs to 5 µs.

According to an embodiment, the ramp is a straight line having a substantially constant slope.

According to an embodiment, the slope of the ramp is, in absolute value, between 0.1 V/µs and 10 V/µs, preferably between 0.5 V/µs and 1.5 V/µs.

According to an embodiment, the drain of the transistor is submitted, during the application of the ramp, to a drain voltage in the range from 1 mV to 500 mV, preferably from 50 mV to 150 mV, with respect to the transistor source.

According to an embodiment, the source and a substrate of the transistor are, during the application of the ramp, taken to a reference potential, preferably the ground.

According to an embodiment, the variations of the gate capacitance of the transistor are deduced from variations of the displacement current in the transistor during the application of the ramp.

According to an embodiment, a value of the effective mobility of the carriers in the transistor is calculated based on:
the gate length of the transistor;
the gate width of the transistor;
the drain current of the transistor;
the drain voltage of the transistor; and
the integral of the gate capacitance of the transistor with respect to the gate voltage during the application of the ramp.

According to an embodiment, a gate leakage current of the transistor is deduced from a measurement of the source current and from a measurement of the drain current during the application of the ramp.

According to an embodiment, an offset of the threshold voltage of the transistor is estimated during first successive phases of application of the ramp of the gate voltage, separated by second phases of application of a non-zero constant voltage to the gate of the transistor.

An embodiment provides an electronic device adapted to implementing the method such as described, the device comprising:
a first pulsed current-vs.-voltage characteristic measurement system which may be coupled, preferably connected, to the gate of the transistor;
a measurement acquisition system coupled to the first pulsed current-vs.-voltage characteristic measurement system; and
a second pulsed current-vs.-voltage characteristic measurement system which may be coupled, preferably connected, to the drain of the transistor.

BRIEF DESCRIPTION OF THE DRAWINGS

The foregoing and other features and advantages of the present invention will be discussed in detail in the following non-limiting description of specific embodiments and implementation modes in connection with the accompanying drawings, in which.

DESCRIPTION OF THE EMBODIMENTS

Figure 1:
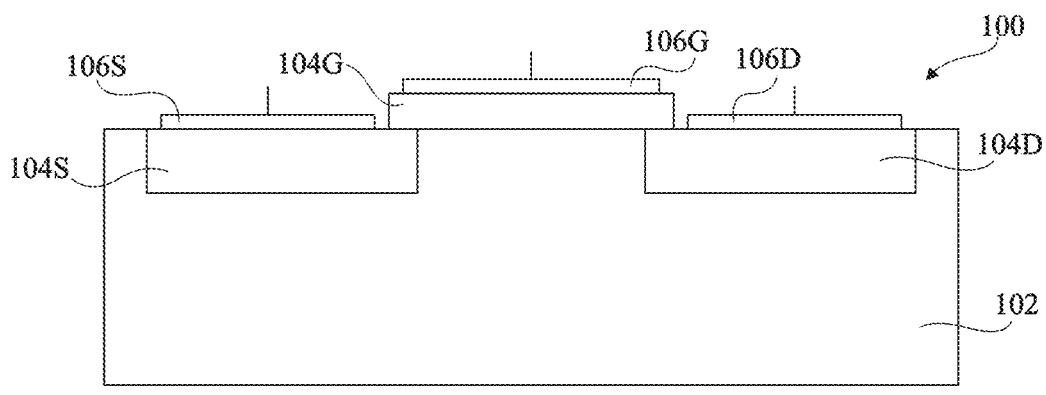
FIG. 1 is a partial simplified cross-section view of an example of a transistor of the type to which the described embodiments and implementation modes apply as an example.

Like features have been designated by like references in the various figures. In particular, the structural and/or functional elements common to the different embodiments and implementation modes may be designated with the same reference numerals and may have identical structural, dimensional, and material properties.

For clarity, only those steps and elements which are useful to the understanding of the described embodiments and implementation modes have been shown and will be detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

FIG. 1 is a partial simplified cross-section view of an example of a transistor 100 of the type to which the described embodiments and implementation modes apply as an example.

In the shown example, transistor 100 is a field-effect transistor. Transistor 100 is for example a metal-oxide-semiconductor field-effect transistor, more commonly called MOS transistor. Transistor 100 is for example formed inside and on top of a semiconductor substrate 102, for example, a doped silicon wafer or piece of wafer of a first conductivity type.

As illustrated in FIG. 1, transistor 100 comprises a source region 104S and a drain region 104D. In the shown example, source and drain regions 104S and 104D are separate, and extend vertically from the upper surface of substrate 102. Source and drain regions 104S and 104D are for example each made of doped silicon of a second conductivity type, different from the first conductivity type.

Transistor 100 further comprises a gate region 104G. In the shown example, gate region 104G is located on top of and in contact with the upper surface of substrate 102. At the surface of substrate 102, gate region 104G extends horizontally above a portion of substrate 102 laterally bordered with source and drain regions 104S and 104D. In FIG. 1, gate region 104G extends above source and drain regions 104S and 104D. In the shown example, gate region 104G partially coats the respective upper surfaces of source region 104S and of drain region 104D. Region 104G is typically made of an electrically-insulating material, for example, an oxide.

In the shown example, a source electrode 106S, a gate electrode 106G, and a drain electrode 106D are respectively formed on top of and in contact with the source region 104S, the gate region 104G, and the drain region 104D of transistor 100. Each of these electrodes 106S, 106G, 106D for example partly covers the free upper surface of the region 104S, 104G, 104D with which it is associated. As an example, electrodes 106S, 106G, and 106D respectively form the source, gate, and drain terminals of transistor 100. Source, gate, and drain electrodes 106S, 106G, and 106D are for example made of an electrically-conductive material.

In a case where substrate 102 is p-type doped and where source and drain regions 104S and 104D are each n-type doped, transistor 100 is called n-channel transistor or nMOS transistor. The majority charge carriers are electrons in this case. If a voltage $V_{GS}$ greater than a threshold voltage $V_{TH}$ is applied between the gate and source electrodes 106G and 106S of transistor 100, electrons may flow within the n channel formed between source and drain regions 104S and 104D.

In another case where substrate 102 is n-type doped and where the source and drain regions 104S and 104D are each p-type doped, transistor 100 is called p-channel transistor, or pMOS transistor. The majority charge carriers are holes in this case. If a voltage $V_{GS}$ smaller than a threshold voltage $V_{TH}$ is applied between the gate and source electrodes 106G and 106S of transistor 100, holes may flow within the p channel formed between source and drain regions 104S and 104D.

When a transistor is desired to be characterized, for example, transistor 100, the effective mobility, noted $\mu_{eff}$, of the majority charge carriers of its conduction channel, may in particular be estimated. In other words, one may estimate the effective mobility of the electrons, in the case of an nMOS-type transistor, or of the holes, in the case of a pMOS-type transistor. The effective mobility $\mu_{eff}$ is for example representative of the electric performance and of the reliability of transistor 100.

To estimate the effective mobility $\mu_{eff}$ of the carriers of a transistor such as transistor 100, measurements of drain current $I_D$ and measurements of gate capacitance C may be performed according to a variable potential $V_G$ imposed on its gate. These two categories of measurements are respectively designated with the terms "$I_D(V_G)$ characteristics" and "$C(V_G)$ characteristics" in the following description.

Figure 2:
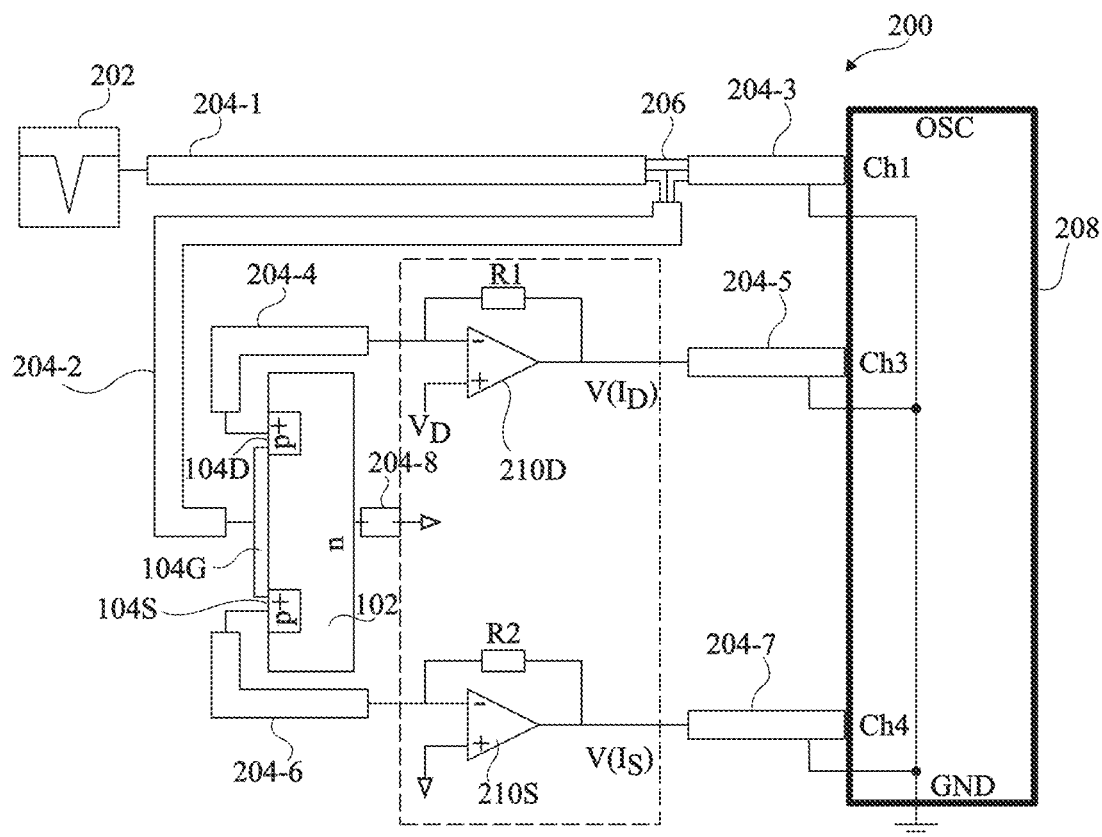
FIG. 2 is an electric diagram of an example of an electronic transistor characterization device.

FIG. 2 is an electric diagram of an example of an electronic transistor characterization device 200. Device 200 may in particular enable to obtain the characteristics $I_D(V_G)$ and $C(V_G)$ of a transistor, for example, the transistor 100 of FIG. 1. In the example of FIG. 2, it is considered that transistor 100 is a pMOS-type transistor having an n-type substrate 102 and having source and drain regions 104S and 104D which are each heavily p-type doped (p+).

In the shown example, device 200 comprises a signal generator 202, for example, a pulse generator. An output of signal generator 202 is coupled or connected to the gate of transistor 100, that is, to gate electrode 106G (not shown), via two cables 204-1 and 204-2 having a tee connector 206 interposed therebetween.

The output of generator 202 is further coupled or connected to an input (Ch1) of an acquisition and/or recording electronic device 208 (OSC), for example, an oscilloscope, via cable 204-1, tee 206, and another cable 204-3. More particularly, in FIG. 2, an end of cable 204-3 is connected to tee 206, the other end of cable 204-3 being connected to input Ch1 of oscilloscope 208.

In the shown example, the drain of transistor 100, that is, drain electrode 106D (not shown), is connected to an inverting input (−) of an operational amplified 210D via another cable 204-4. The non-inverting input (+) of amplifier 210D is taken to a drain potential node $V_D$. At the output of amplifier 210D, a voltage $V(I_D)$ which is an image of the drain current $I_D$ of transistor 100, for example, proportional to current $I_D$, is obtained. In the shown example, the output of amplifier 210D is connected to another input (Ch3) of oscilloscope 208 via another cable 204-5. In FIG. 2, a resistor (R1) is connected between the inverting input and the output of amplifier 210D.

In the shown example, the source of transistor 100, that is, source electrode 106S (not shown in FIG. 2), is connected to an inverting input (−) of another operational amplifier 210S via another cable 204-6. The non-inverting input (+) of amplifier 210S is taken to a reference potential, for example, the ground. At the output of amplifier 210S, a voltage V(I$_S$) which is an image of a source current I$_S$ of transistor 100, for example, proportional to current I$_S$, is obtained. In the shown example, the output of amplifier 210S is connected to another input (Ch4) of oscilloscope 208 via another cable 204-7. In FIG. 2, another resistor (R2) is connected between the inverting input and the output of amplifier 210S.

In FIG. 2, the substrate 102 of transistor 100 is taken to the reference potential. In the shown example, the surface of substrate 102 opposite to source, gate, and drain regions 104S, 104G, and 104D is set to ground via another cable 204-8.

Cables 204-1, 204-2, 204-3, 204-4, 204-5, 204-6, 204-7, and 204-8 are for example coaxial cables, having a grounded jacket. In the shown example, the jacket of each cable 204-3, 204-5, 204-7 is connected to a ground terminal (GND) of oscilloscope 208. As an example, the signal generator 202 and the oscilloscope 208 of circuit 200 may respectively have an output impedance and an input impedance equal to approximately 50Ω.

The operation of device 200 is discussed in further detail in relation with FIGS. 3 to 6 hereabove.

Figure 3:
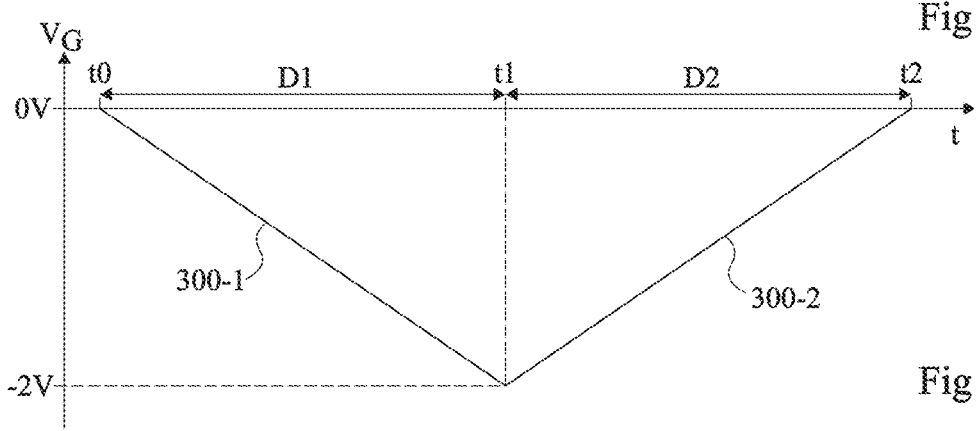
FIG. 3 is an example of a timing diagram associated with an example of a transistor characterization method.

FIG. 3 is an example of a timing diagram associated with an example of a transistor characterization method. FIG. 3 for example illustrates the variation, over time (t), of the voltage V$_G$ imposed on gate electrode 106G (FIG. 1) of transistor 100 by the generator 202 (FIG. 2) of device 200.

In the shown example, gate voltage V$_G$ first follows a first decreasing linear ramp 300-1, in other words a straight line having a negative slope. Voltage V$_G$ then follows a second increasing linear ramp 300-2, in other words another line having a positive slope. In the example illustrated in FIG. 3, gate voltage V$_G$ decreases from 0 V to −2 V between a time t0 and a time t1, subsequent to time t0. Gate voltage V$_G$ then increases from −2 V to 0 V between time t1 and a time t2, subsequent to time t1. In FIG. 3, times t0 and t1 are separated by a time period D1, while times t1 and t2 are separated by another time period D2. As an example, time periods D1 and D2 are each in the order of a few microseconds or tens of microseconds.

In practice, the transition between ramp 300-1 of negative slope and ramp 300-2 of positive slope may occur via a plateau. Gate voltage V$_G$ may for example be maintained at a constant value of approximately −2 V for a few tenths or hundredths of microseconds between ramps 300-1 and 300-2.

As an example, during ramps 300-1 and 300-2, the bias potential V$_D$ (FIG. 2) of the drain of transistor 100 is maintained at a substantially constant value. Potential V$_D$ is for example maintained equal to approximately minus one hundred millivolts (−100 mV) between times t0 and t2.

Figure 4:
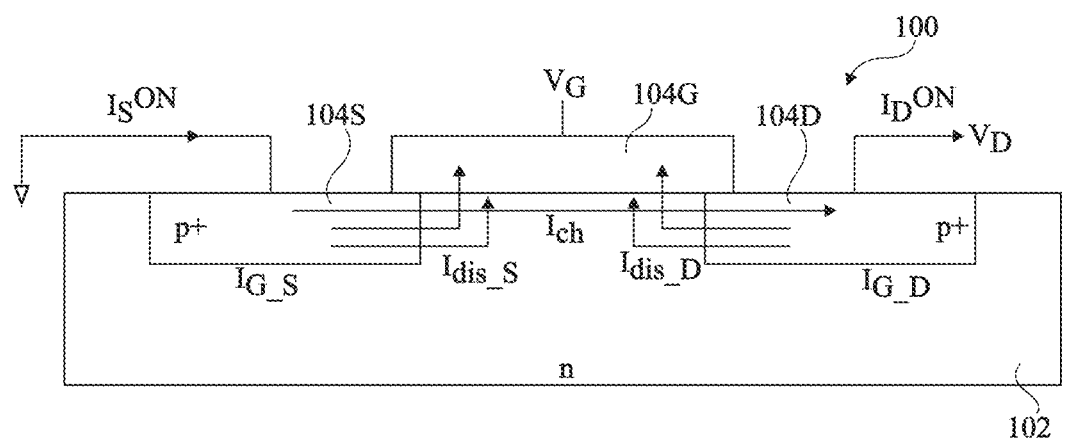
FIG. 4 is a partial simplified cross-section view of the transistor of FIG. 1 during a step of the method of FIG. 3.

FIG. 4 is a partial simplified cross-section view of the transistor 100 of FIG. 1 during a step of a method of FIG. 3. FIG. 4 symbolizes, in particular, electric currents which flow through transistor 100 during the application of the decreasing ramp 300-1 (FIG. 3) of gate voltage V$_G$.

In the following description, I$_D^{ON}$ and I$_S^{ON}$ designate the currents respectively measured from the drain electrode 106D and from the source electrode 106S of transistor 100 (FIG. 1) during ramp 300-1 of negative slope. During the application of ramp 300-1, drain current I$_D^{ON}$ is equal, in absolute value, to a channel current, noted I$_{ch}$, minus a gate leakage current on the drain side, noted I$_{G\_D}$,
and minus a displacement current on the drain side, noted I$_{dis\_D}$. In other words, current I$_D^{ON}$ verifies the following relation:

$$\left|I_D^{ON}\right| = I_{ch} - I_{G\_D} - I_{dis\_D} \qquad \text{[Math 1]}$$

Similarly, during the application of ramp 300-1, source current I$_S^{ON}$ is equal, in absolute value, to the sum of a gate leakage current on the source side, noted I$_{G\_S}$, of a displacement current on the source side, noted I$_{dis\_S}$, and of channel current I$_{ch}$. In other words, current I$_S^{ON}$ verifies the following relation:

$$\left|I_S^{ON}\right| = I_{G\_S} + I_{dis\_S} + I_{ch} \qquad \text{[Math 2]}$$

During ramp 300-1, the displacement current on the drain side is due to a charge of a capacitive element between the gate electrode 106G and the drain electrode 106D of transistor 100 (FIG. 1). Similarly, during ramp 300-1, the displacement current I$_{dis\_S}$ on the source side is due to a charge of a capacitive element located between the gate electrode 106G and the source electrode 106S of transistor 100 (FIG. 1). During ramp 300-1, current I$_{dis\_D}$ is oriented from drain region 104D to gate region 104G, and current I$_{dis\_S}$ is oriented from source region 104S to gate region 104G.

The gate leakage current I$_{G\_D}$ on the drain side corresponds to an unwanted current crossing gate region 104G on the side of drain region 104D. Similarly, the gate leakage current I$_{G\_S}$ on the source side corresponds to an unwanted current crossing gate region 104G on the side of source region 104S. During ramp 300-1, current I$_{G\_D}$ is oriented from drain region 104D to gate region 104G, and current I$_{G\_S}$ is oriented from source region 104S to gate region 104G.

During ramp 300-1, channel current I$_{ch}$ is oriented from source region 104S to drain region 104D.

Figure 5:
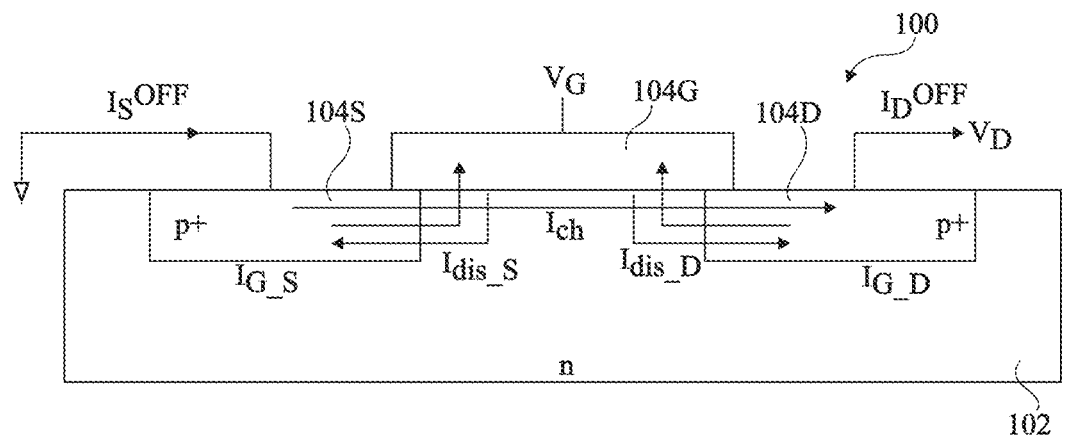
FIG. 5 is a partial simplified cross-section view of the transistor of FIG. 1 during another step of the method of FIG. 3.

FIG. 5 is a partial simplified cross-section view of the transistor 100 of FIG. 1 during another step of the method of FIG. 3. FIG. 5 symbolizes, in particular, electric currents which flow through transistors 100 during the application of the increasing ramp 300-2 (FIG. 3) of gate voltage V$_G$.

In the rest of the description, note I$_D^{OFF}$ and I$_S^{OFF}$ the currents respectively measured from the drain electrode 106D and from the source electrode 106S of transistor 100 (FIG. 1) during ramp 300-2 of positive slope.

During the application of ramp 300-2, drain current I$_D^{OFF}$ is equal, in absolute value, to the sum of the displacement current I$_{dis\_D}$ on the drain side and of the channel current I$_{ch}$, minus the gate leakage current I$_{G\_D}$ on the drain side. In other words, current I$_D^{OFF}$ verifies the following relation:

$$\left|I_D^{OFF}\right| = I_{dis\_D} + I_{ch} - I_{G\_D} \qquad \text{[Math 3]}$$

Similarly, during the application of ramp 300-2, source current I$_S^{OFF}$ is equal, in absolute value, to the sum of the gate leakage current I$_{G\_S}$ on the source side and of the channel current I$_{ch}$, minus the displacement current I$_{dis\_S}$ on the source side. In other words, current I$_S^{OFF}$ verifies the following relation:

$$\left|I_S^{OFF}\right| = I_{G\_S} - I_{dis\_S} + I_{ch} \qquad \text{[Math 4]}$$

During ramp 300-2, the displacement current $I_{dis\_D}$ on the drain side is due to a discharge of the capacitive element between the gate electrode 106G and the drain electrode 106D of transistor 100 (FIG. 1). Similarly, during ramp 300-2, the displacement current $I_{dis\_S}$ on the source side is due to a discharge of the capacitive element between the gate electrode 106G and the source electrode 106S of transistor 100 (FIG. 1). During ramp 300-2, current $I_{dis\_D}$ is oriented from gate region 104G to drain region 104D, and current $I_{dis\_S}$ is oriented from gate region 104G to source region 104S.

During ramp 300-2, the leakage current $I_{G\_D}$ on the drain side, the leakage current $I_{G\_S}$ on the source side, and the channel current $I_{ch}$ are oriented in the same way as during ramp 300-1.

In the example of the method discussed hereabove in relation with FIGS. 3 to 5, the currents $I_D^{ON}$ and $I_S^{ON}$ measured during ramp 300-1 and the currents $I_D^{OFF}$ and $I_S^{OFF}$ measured during ramp 300-2 enable to obtain drain current $I_D$ by applying the following formula:

$$I_D = \frac{\left|I_D^{ON}\right| + \left|I_D^{OFF}\right| + \left|I_S^{ON}\right| + \left|I_S^{OFF}\right|}{4} \qquad \text{[Math 5]}$$

Based on the previous formula, the characteristic $I_D(V_G)$ of transistor 100 can be deduced.

Further, in the example of the method discussed hereabove in relation with FIGS. 3 to 5, the currents $I_D^{ON}$ and $I_S^{ON}$ measured during ramp 300-1 and the currents $I_D^{OFF}$ and $I_S^{OFF}$ measured during ramp 300-2 enable to obtain a gate leakage current, noted IG, by applying the following formula:

$$I_G = \frac{\left|I_S^{ON}\right| + \left|I_S^{OFF}\right| - \left|I_D^{ON}\right| - \left|I_D^{OFF}\right|}{2} \qquad \text{[Math 6]}$$

Based on the above equations [Math 1] to [Math 4], a general displacement current noted $I_{dis}$, can be deduced. Current $I_{dis}$ verifies the following relation:

$$I_{dis} = \frac{\left|I_S^{ON}\right| - \left|I_S^{OFF}\right| + \left|I_D^{OFF}\right| - \left|I_D^{ON}\right|}{2} \qquad \text{[Math 7]}$$

Starting from current $I_{dis}$, the characteristic $C(V_G)$ of transistor 100 can be deduced by applying the following formula:

$$C = \frac{I_{dis}}{\frac{dV_c}{dt}} \qquad \text{[Math 8]}$$

Assuming that transistor 100 has a gate length L and a gate width W, the effective mobility $\mu_{eff}$ of transistor 100 can be calculated by applying the following relation:

$$\mu_{eff} = \frac{L}{W} \cdot \frac{I_D}{Q_i V_D} \qquad \text{[Math 9]}$$

In relation [Math 9], $Q_i$ represents the density of mobile charges in the channel of transistor 100. Density $Q_i$ corresponds to the integral of characteristic $C(V_G)$:

$$Q_i = \int_{+\infty}^{V_G} C dV_G \qquad \text{[Math 10]}$$

Figure 6:
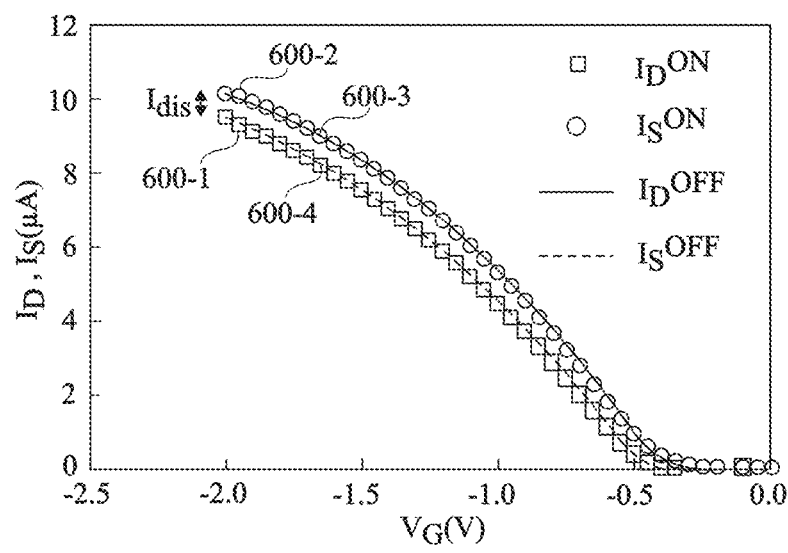
FIG. 6 is an example of a graph of variation of the source current and of the drain current of the transistor of FIG. 1 during the implementation of the method of FIG. 3.

FIG. 6 is an example of a graph of the variation of the source current $I_S$ (in microamperes) and of the drain current $I_D$ (in microamperes) of the transistor 100 of FIG. 1 according to gate potential $V_G$ (in volts) during the implementation of the method of FIG. 3. In particular, FIG. 6 illustrates an example of the variation of current $I_D^{ON}$ (curve 600-1) and of current $I_S^{ON}$ (curve 600-2) during ramp 300-1, as well as of current $I_D^{OFF}$ (curve 600-3), and of current $I_S^{OFF}$ (curve 600-4) during ramp 300-2.

In the shown example, curves 600-1 and 600-4 are almost superimposed and curves 600-2 and 600-3 are almost superimposed. As illustrated in FIG. 6, displacement current $I_{dis}$ is in this case substantially equal, for a given gate potential $V_G$, for example, −2 V, to the interval between curves 600-2 and 600-4 or to the interval between curves 600-3 and 600-1. In other words, in the shown example where $I_D^{ON} \approx I_S^{OFF}$ and where $I_D^{OFF} \approx I_S^{ON}$, relation [Math 7] may be simplified as follows:

$$I_{dis} \approx \left|I_S^{ON}\right| - \left|I_S^{OFF}\right| \approx \left|I_D^{OFF}\right| - \left|I_D^{ON}\right| \qquad \text{[Math 11]}$$

A disadvantage of the characterization method discussed hereabove in relation with FIGS. 3 to 6 lies in the fact that, as in the example illustrated in FIG. 6, curves 600-1 and 600-4 are often very close to curves 600-2 and 600-3. This generally does not enable to accurately estimate the value of displacement current $I_{dis}$, the transistor characteristic $C(V_G)$ is thus altered.

Another disadvantage of the characterization method discussed hereabove in relation with FIGS. 3 to 6 lies in the fact that the estimation of displacement current $I_{dis}$ requires the application of two ramps 300-1 and 300-2 having opposite slopes. The measurements performed during ramp 300-2 are for example likely to be disturbed by trap states, which may for example be activated during the application of ramp 300-1. This may alter the estimate of current $I_{dis}$ and adversely affect the accuracy of the characteristic $C(V_G)$ obtained at the end of the two ramps 300-1 and 300-2.

What has been described hereabove in relation with an example of a pMOS-type transistor also applies to other field-effect transistors, for example, nMOS-type transistors.

Figure 7:
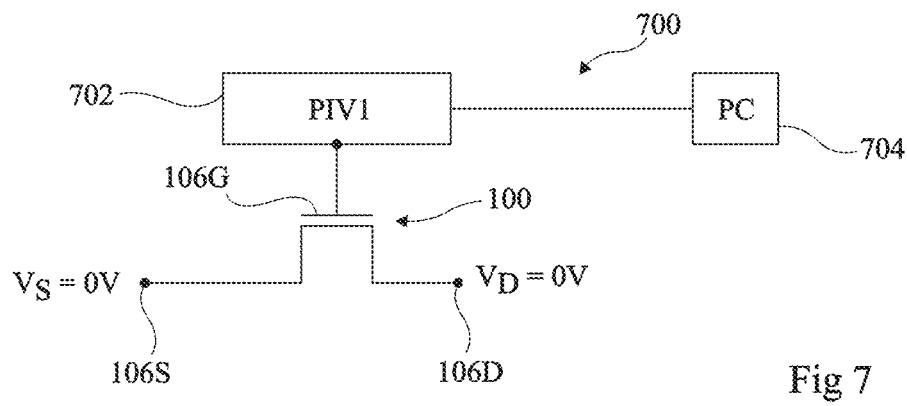
FIG. 7 is an electric diagram of an embodiment of an electronic transistor characterization device.

FIG. 7 is an electric diagram of an embodiment of an electronic transistor characterization device 700, for example, the transistor 100 of FIG. 1. In the following description, it is considered that transistor 100 is an nMOS-type transistor having its substrate 102 for example p-type doped and having its source and drain regions 104S and 104D for example each n-type doped.

Device 700 comprises a first pulsed current-vs.-voltage characteristic measurement (Pulsed IV) system 702 (PIV1). As an example, system 702 is a measurement system known under trade name "Model B1350" of KEYSIGHT. System 702 is coupled, preferably connected, to the gate electrode or terminal 106G of transistor 100. In the shown example, system 702 is further coupled to a measurement acquisition system 704 (PC), for example, a computer.

In operation, system 702 is configured to submit electrode 106G to voltage pulses $V_G$ and to measure the resulting electric current. This current corresponds to the general displacement current $I_{dis}$ as previously discussed in relation with FIG. 5. The voltage pulses applied to the gate of transistor 100 by system 702 for example each have a duration in the order of some ten or even some hundred nanoseconds.

In the shown example, the source electrode 106S of transistor 100 is taken to a reference potential, preferably the ground ($V_S$=0 V). Similarly, the drain electrode 106D of transistor 100 is taken to the reference potential, preferably the ground ($V_D$=0 V). In other words, the source and the drain of transistor 100 are both grounded.

Device 700 particularly enables to obtain the characteristic $C(V_G)$ of a transistor by applying to the gate electrode 106G a single voltage ramp $V_G$ having a positive or negative slope. In practice, the system 702 of device 700 is for example configured to apply, to the gate electrode 106G of transistor 100, voltage pulses $V_G$ having an increasing amplitude in the case of a ramp with a positive slope.

Figure 8:
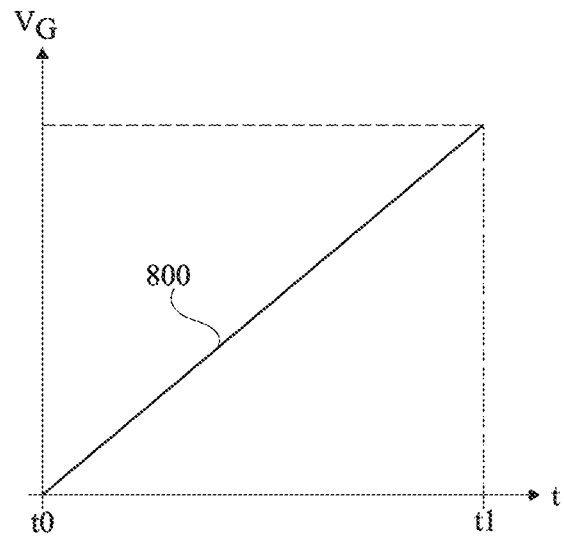
FIG. 8 is an example of a timing diagram associated with an implementation mode of a transistor characterization method.

FIG. 8 is an example of a timing diagram associated with an implementation mode of a transistor characterization method. FIG. 8 for example corresponds to a timing diagram of an implementation mode of a method of characterizing transistor 100 by using the device 700 of FIG. 7.

In the shown example, the gate voltage applied to the gate electrode 106G of transistor 100 (FIG. 7) follows a ramp 800 having a positive slope between a time t0 and a time t1, subsequent to time t0. Ramp 800 is for example a straight line having a substantially constant slope. During ramp 800, the displacement current $I_{dis}$ is measured from gate electrode 106G. This for example enables to deduce the characteristic $C(V_G)$ of transistor 100 by applying formula [Math 8].

Ramp 800 is applied for a time period (t1-t0) in the range from 1 µs to 20 µs, preferably from 1 µs to 5 µs, for example, equal to approximately 3 µs.

In the shown example, ramp 800 has a slope $dV_G/dt$ between 0.1 V/µs and 10 V/µs, preferably between 0.5 V/µs and 1.5 V/µs. Ramp 800 for example has a slope $dV_G/dt$ equal to approximately 1 V/µs. The faster ramp 800, the higher the displacement current $I_{dis}$. An advantage of using a ramp 800 comprising a slope in the order of one volt per microsecond lies in the fact that this for example enables to achieve a measurement accuracy greater than that which would be obtained due to the method discussed in relation with FIG. 6.

The step of measuring the current $I_{dis}$ from the gate of transistor 100 may in practice be preceded by a calibration step. The calibration step is for example carried out in a configuration where measurement points of system 702 (FIG. 7) are not placed into contact with transistor 100. This for example enables to obtain a parasitic displacement current value originating from an intrinsic capacitance of system 702. This value may then be subtracted from the measurement of the displacement current $I_{dis}$ performed by placing the measurement points of system 702 in contact with transistor 100 and by applying ramp 800 of gate voltage $V_G$.

An implementation mode where the transistor is of pMOS type and where ramp 800 has a positive slope has been described in relation with FIG. 8. This is however not limiting. It will be within the abilities of those skilled in the art to adapt the described implementation mode to other types of field-effect transistors, particularly to an nMOS-type transistor. Further, it will be within the abilities of those skilled in the art to transpose the described embodiment to a characterization method where voltage ramp $V_G$ is a straight line having a negative slope and a value equal, to within the sign, to the value of slope 800.

Figure 9:
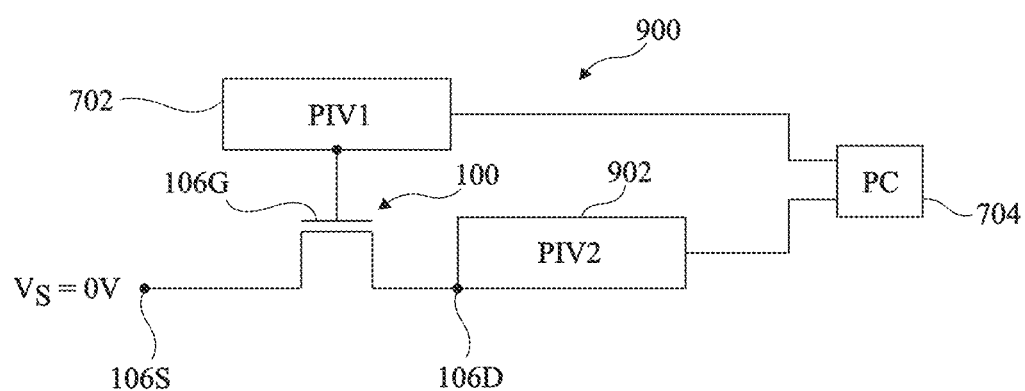
FIG. 9 is an electric diagram of an embodiment of another electronic transistor characterization device.

FIG. 9 is an electric diagram of an embodiment of another electronic device 900 for characterizing transistors, for example, transistor 100. The device 900 of FIG. 9 comprises elements common with the device 700 of FIG. 7. These common elements will not be described again hereafter.

The device 900 of FIG. 9 differs from the device 700 of FIG. 7 mainly in that, in the case of device 900, the drain electrode 106D of transistor 100 is coupled, preferably connected, to a second pulsed current-vs.-voltage characteristic measurement system 902 (PIV2). System 902 is for example similar to system 702. In the shown example, system 902 is coupled to computer 704 (PC).

In operation, system 902 is configured to submit the drain electrode 106D of transistor 100 to a voltage $V_D$ in the range from 1 mV to 500 mV, preferably from 50 mV to 150 mV. System 902 is for example configured to apply a voltage equal to approximately 100 mV to the drain of transistor 100. In operation, system 902 is further configured to measure drain current $I_D$ from the drain electrode 106D of transistor 100.

By applying to electrode 106G a single ramp 800 (FIG. 8) of voltage $V_G$ and by imposing on electrode 106S a substantially constant voltage Vs, variations of the displacement current $I_{dis}$ and of the drain current $I_D$ can be measured at a time. In other words, one may, based on a single ramp, interpret both variations of the gate capacitance C and of the drain current $I_D$ of transistor 100. This for example enables to obtain in a single ramp 800 characteristic $C(V_G)$ and characteristic $I_D(V_G)$ of transistor 100. Based on characteristic $C(V_G)$, the mobility $\mu_{eff}$ of the carriers in the channel of transistor 100 can in particular be deduced, for example, by applying relation [Math 9].

It could be believed that the measurement of characteristic $C(V_G)$ would be disturbed by the application of a non-zero drain voltage $V_D$, for example, due to a modification of the potential difference between source and drain electrodes 106S and 106D. In practice, the inventors have however observed that the application of a voltage $V_D$ smaller than 500 mV has a negligible influence on the obtained characteristics $C(V_G)$. This is particularly true for transistors having a gate capacitance C greater than approximately 10 pF, for example, for transistors having a gate with a width in the order of 30 nm and a surface area in the order of 8,000 µm$^2$ and submitted to a ramp having a slope equal to approximately 1 V/µs.

In the implementation mode discussed in relation with FIG. 9, it is considered for simplification that the gate leakage current $I_{G\_S}$ on the source side and the gate leakage current $I_{G\_D}$ on the drain side of transistor 100 are both negligible. This may for example be explained by the fact that the gate region 104G of transistor 100 has a thickness in the order of a few tens of nanometers. As an example, gate region 104G is formed of a layer of alumina (Al$_2$O$_3$) having a 30-nm thickness.

As a variant, for example, in cases where currents $I_{G\_S}$ and $I_{G\_D}$ are not negligible, a third pulsed current-vs.-voltage characteristic measurement system (not shown) may be coupled, preferably connected, to the source electrode 106S of transistor 100. As an example, the third system may be configured to apply a zero source voltage Vs and to measure the source current $I_S$ during ramp 800 (FIG. 8) of voltage $V_G$. Considering for simplification that the leakage current of substrate 102 (FIG. 1) is negligible, gate leakage current $I_G$ verifies in this case the following relation:

$$I_G = |I_D| - |I_S| \qquad \text{[Math 12]}$$

Although implementation modes of transistor characterization methods applied to a case where transistor 100 is of nMOS type have been described hereabove in relation with FIGS. 7 to 9, it will be within the abilities of those skilled in the art to transpose what has been previously discussed to other types of field-effect transistors, in particular to a case where transistor 100 is of pMOS type.

Figure 10:
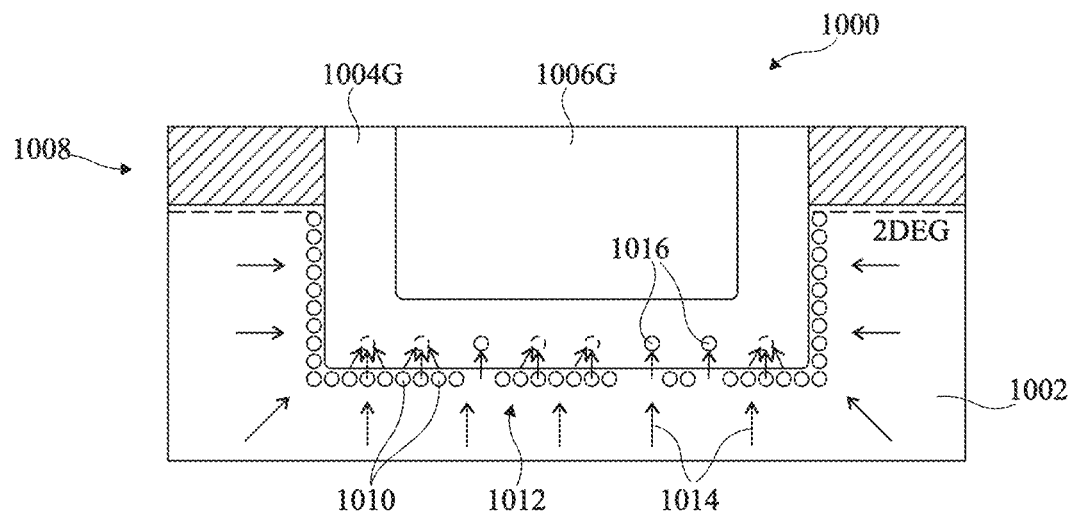
FIG. 10 is a partial simplified cross-section view of an example of a transistor in an operating mode.

FIG. 10 is a partial simplified cross-section view of an example of a transistor 1000 in an operating mode. FIG. 10 more particularly symbolizes an accumulation of electric charges in the vicinity of an interface between a substrate 1002, inside and on top of which is formed transistor 1000, and a gate oxide region 1004G.

In the shown example, gate oxide region 1004G has, in cross-section view, a "U" shape. Region 1004G extends vertically from the upper surface of substrate 1002. A gate electrode 1006G is for example formed on top of and in contact with gate oxide region 1004G.

In FIG. 10, region 1004G separates two portions of a passivation layer 1008 partially covering the upper surface of substrate 1002. In FIG. 10, the portions of passivation layer 1008 are symbolized by hatched areas.

As an example:
substrate 1002 is made of gallium nitride (GaN);
gate oxide region 1004G is made of alumina ($Al_2O_3$); and
passivation layer 1008 is made of aluminum gallium nitride (AlGaN).

FIG. 10 illustrates in particular a situation where a gate potential $V_G$ greater than a threshold voltage of transistor $V_{TH}$ 1000 is applied to gate electrode 1006G. In this situation, charges 1010 forming part of an electron channel 1012 formed between two portions of a two-dimensional electron gas (2DEG) are submitted to an electric field symbolized by arrows 1014 directed towards gate electrode 1006G. This causes the trapping, in gate oxide layer 1004G, of charges 1016 originating from electron channel 1012. The operating mode illustrated in FIG. 10 is called "build-up mode" due to the fact that charges, here electrons, build up in gate oxide layer 1004G.

Figure 11:
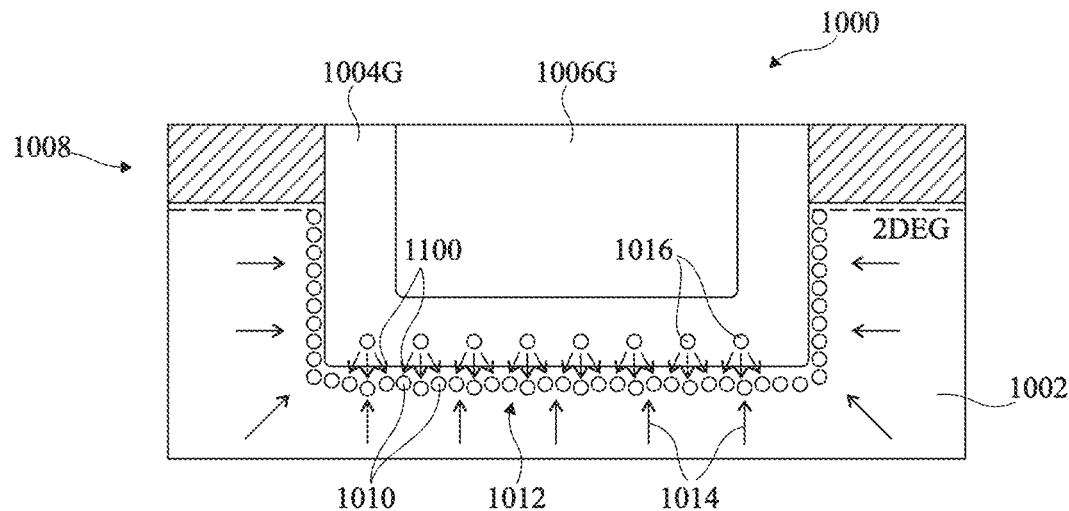
FIG. 11 is a partial simplified cross-section view of the transistor of FIG. 10 in another operating mode.

FIG. 11 is a partial simplified cross-section view of the transistor 1000 of FIG. 10 in another operating mode. FIG. 11 more particularly symbolizes the influence of the electric charges 1016 trapped in the gate oxide region 1004G of transistor 1000.

FIG. 11 particularly illustrates a situation subsequent to the application, to the gate electrode 1006G of transistor 1000, of a gate potential $V_G$ greater than threshold voltage $V_{TH}$ for a time period for example in the order of several seconds. In this situation, the charges 1016 trapped in gate oxide layer 1004G each generate an electric field symbolized by arrows 1100. The electric field 1100 generated by each charge 1016 tends to oppose the electric field 1014 of the charges 1010 of electron channel 1012.

The presence of charges 1016 in layer 1004G causes a phenomenon called bias temperature instability (BTI). This phenomenon particularly causes a progressive degradation of the electric performance of transistor 1000. As an example this phenomenon may be responsible for an offset or a drift $\Delta V_{TH}$ of the threshold voltage $V_{TH}$ of transistor 1000 over time.

Figure 12:
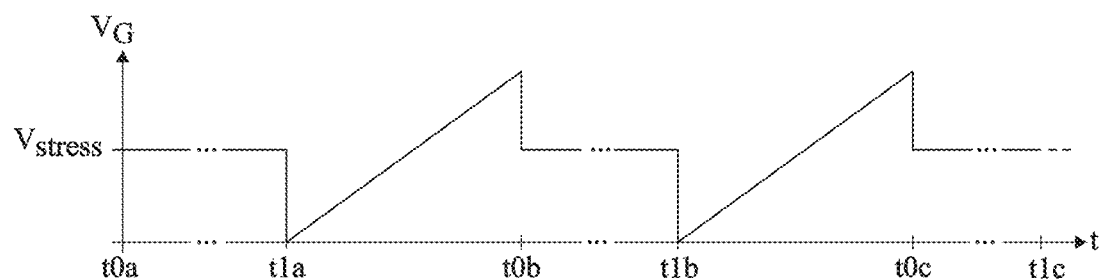
FIG. 12 is an example of a timing diagram associated with an implementation mode of a method of estimating a drift in the threshold voltage of a transistor.

FIG. 12 is an example of a timing diagram associated with an implementation mode of a method of estimating a drift $\Delta V_{TH}$ in the threshold voltage of a transistor, for example, transistor 1000 (FIG. 10).

In the shown example, a substantially constant gate voltage $V_G$, noted $V_{stress}$, is applied between a time t0 (t0a, t0b, t0c) and a time t1 (t1a, t1b, t1c), on electrode 1006G (FIG. 10). Between successive times t1 and t0, $V_{stress}$ stops being applied to estimate the characteristics $C(V_G)$ and $I_D(V_G)$ of transistor 1000. To achieve this, ramps of gate voltage $V_G$ for example similar to the ramp 800 described in relation with FIG. 8 are applied. As an example, voltage $V_{stress}$ is in the order of several volts, for example, equal to approximately 4 V. The time of application of voltage $V_{stress}$ between two consecutive times t0 and t1 is, for example, in the order of several seconds.

The methods of estimating characteristics $C(V_G)$ and $I_D(V_G)$ discussed hereabove in relation with FIGS. 7 to 9 advantageously enable to limit the time separating each time t1 from the next time t0. This for example limits the occurrence of a so-called recovery phenomenon, during which the charges 1016 (FIG. 10) trapped in gate oxide layer 1004G tend to return to the channel 1012 formed in substrate 1002. The recovery phenomenon indeed alters the estimation of characteristic $C(V_G)$, since it causes an attenuation of electric field 1100.

An advantage of the characterization methods discussed hereabove in relation with FIGS. 7 to 12 lies in the fact that they are capable of providing an estimate of the displacement current $I_{dis}$ and a characteristic $C(V_G)$ of the transistor more accurate than those which would be obtained by current characterization methods.

Another advantage of the characterization methods discussed hereabove in relation with FIGS. 7 to 12 lies in the fact that the estimation of displacement current $I_{dis}$ is achieved by the application of a single ramp 800. The measurements performed during ramp 800 are particularly unlikely to be disturbed by trap states. This improves the accuracy of the estimation of current $I_{dis}$ and of the characteristic $C(V_G)$ obtained at the end of a single ramp 800.

Various embodiments and variants have been described. Those skilled in the art will understand that certain features of these various embodiments and variants may be combined, and other variants will occur to those skilled in the art. In particular, what is described hereabove in relation with an implementation mode where voltage ramp 800 has a positive slope can be transposed by those skilled in the art to a case where the voltage ramp applied to the transistor gate has a negative slope.

Finally, the practical implementation of the described embodiments and variants is within the abilities of those skilled in the art based on the functional indications given hereabove. In particular, the practical implementation of pulsed current-vs.-voltage characteristic measurement systems 702 and 902 is within the abilities of those skilled in the art.

The invention claimed is:

1. A method of characterizing a field-effect transistor, comprising:
   a step of application, to the gate of the transistor, of a single ramp of the gate voltage;
   a step of measurement of a drain current and of a gate capacitance of the transistor during the application of the single ramp of the gate voltage; and a step of interpretation both of variations of the gate capacitance and of variations of the drain current of the transistor to determine a gate leakage current of the transistor.

2. The method according to claim 1, wherein the ramp is applied for a time period in the range from 1 μs to 20 μs, preferably from 1 μs to 5 μs.

3. The method according to claim 1, wherein the ramp is a straight light having a substantially constant slope.

4. The method according to claim 3, wherein the slope of the ramp is in the range, in absolute value, from 0.1 V/μs to 10 V/μs, preferably from 0.5 V/μs to 1.5 V/μs.

5. The method according to claim 1, wherein the drain of the transistor is submitted, during the application of the ramp, to a drain voltage in the range from 1 mV to 500 mV, preferably from 50 mV to 150 mV, with respect to the source of the transistor.

6. The method according to claim 1, wherein the source and a substrate of the transistor are, during the application of the ramp, taken to a reference potential, preferably the ground.

7. The method according to claim 1, wherein the variations of the gate capacitance of the transistor are deduced from variations of the displacement current in the transistor during the application of the ramp.

8. The method according to claim 1, wherein an effective mobility value of the carriers in the transistor is calculated based on:
- the gate length of the transistor;
- the gate width of the transistor;
- the drain current of the transistor;
- a drain voltage of the transistor; and
- the integral of the gate capacitance of the transistor with respect to the gate voltage during the application of the ramp.

9. The method according to claim 1, wherein an offset of the threshold voltage of the transistor is estimated during first successive phases of application of the ramp of the gate voltage, separated by second phases of application of a non-zero constant voltage to the gate of the transistor.

10. An electronic device adapted to implementing the method according to claim 1, the device comprising:
- a first pulsed current-vs.-voltage characteristic measurement system which may be coupled, preferably connected, to the gate of the transistor;
- a measurement acquisition system coupled to the first pulsed current-vs.-voltage characteristic measurement system; and
- a second pulsed current-vs.-voltage characteristic measurement system which may be coupled, preferably connected, to the drain of the transistor.

* * * * *